(12) United States Patent
Higashide

(10) Patent No.: US 9,041,455 B2
(45) Date of Patent: May 26, 2015

(54) SEMICONDUCTOR DEVICE AND COMMUNICATION INTERFACE CIRCUIT

(71) Applicant: Renesas Electronics Corporation, Kawasaki-shi, Kanagawa (JP)

(72) Inventor: Tomofumi Higashide, Kanagawa (JP)

(73) Assignee: RENESAS ELECTRONICS CORPORATION, Kawasaki-shi (JP)

( * ) Notice: Subject to any disclaimer, the term of this patent is extended or adjusted under 35 U.S.C. 154(b) by 0 days.

(21) Appl. No.: 13/747,516

(22) Filed: Jan. 23, 2013

(65) Prior Publication Data

US 2013/0194024 A1    Aug. 1, 2013

(30) Foreign Application Priority Data

Jan. 24, 2012 (JP) .................. 2012-011639

(51) Int. Cl.
| | |
|---|---|
| *H03K 17/687* | (2006.01) |
| *H03K 17/16* | (2006.01) |
| *H03K 19/0185* | (2006.01) |

(52) U.S. Cl.
CPC .......... *H03K 17/162* (2013.01); *H03K 19/0185* (2013.01); *H03K 2217/0018* (2013.01); *H03K 2217/0054* (2013.01)

(58) Field of Classification Search
USPC .................. 327/392–394, 398, 399, 427, 407
See application file for complete search history.

(56) References Cited

U.S. PATENT DOCUMENTS

| | | | | |
|---|---|---|---|---|
| 5,371,420 A | * | 12/1994 | Nakao | 326/27 |
| 5,635,745 A | * | 6/1997 | Hoeld | 257/372 |
| 6,064,248 A | * | 5/2000 | Seki | 327/296 |
| 6,169,443 B1 | * | 1/2001 | Shigehara et al. | 327/534 |
| 6,462,611 B2 | * | 10/2002 | Shigehara et al. | 327/534 |
| 8,907,633 B2 | * | 12/2014 | Fischbach et al. | 320/162 |

FOREIGN PATENT DOCUMENTS

| | | |
|---|---|---|
| JP | A-63-144620 | 6/1988 |
| JP | A-02-268017 | 1/1990 |
| JP | A-04-306912 | 10/1992 |
| JP | 2011-217513 A | 10/2011 |

OTHER PUBLICATIONS

USB Implementers Forum, Inc., "Battery Charging Specification: Revision 1.2," Dec. 7, 2010.
Issued Office Action dated Mar. 17, 2015, for Japanese Application No. 2012-011639, with English language translation.

\* cited by examiner

*Primary Examiner* — Hai L Nguyen
(74) *Attorney, Agent, or Firm* — Miles & Stockbridge P.C.

(57) ABSTRACT

A semiconductor device prevents recognition failure in mutual recognition between a host and a device compliant with USB Specifications. The semiconductor device includes: an interterminal opening/closing section having a plurality of first conductivity type MOS transistors, the respective sources or drains of which are cascaded, in which the source or drain of a first-stage MOS transistor among the cascaded MOS transistors is used as a first terminal, the source or drain of a final-stage MOS transistor among the cascaded MOS transistors is used as a second terminal, and the respective gates of the cascaded MOS transistors receive a control signal for controlling the opening or short-circuiting between the first and second terminals; and a current bypass section that reduces a current flowing into either one connection node coupling the respective sources or drains of the cascaded MOS transistors.

11 Claims, 11 Drawing Sheets

20: TRANSFER GATE

| DCP_E | P02 AND P03 | P04 | STATE BETWEEN TERMINALS |
|---|---|---|---|
| L-LEVEL | ON | OFF | SHORT CIRCUIT |
| H-LEVEL | OFF | ON | OPEN CIRCUIT |

SEMICONDUCTOR DEVICE AND COMMUNICATION INTERFACE CIRCUIT

CROSS-REFERENCE TO RELATED APPLICATION

The disclosure of Japanese Patent Application No. 2012-011639 filed on Jan. 24, 2012 including the specification, drawings and abstract is incorporated herein by reference in its entirety.

BACKGROUND

The present invention relates to a semiconductor device and a communication interface circuits. The present invention can be suitably utilized for a semiconductor device that short-circuits terminals and a communication interface circuit including this semiconductor device, for example.

Recently, USB (Universal Serial Bus) Specifications have been widely spread as a measure for realizing data communication between electronic devices and/or information processors. Above all, a computer, a peripheral device, and the like compliant with USB 2.0 among USB Specifications are widely used.

Here, also in the initial USB 2.0 Specification, by coupling a host (e.g., a computer) and a device (e.g., a portable music player) provided with a battery to each other, the charging of the battery of the device was possible. However, the upper limit of a supply power in this case is limited to 5 V/500 mA, and thus there is a strong demand for increasing the upper limit. This is because when the power supply capability on the host side increases, the battery charging on the device side is also quickly completed.

Therefore, an additional specification has been formulated with respect to USB 2.0 Specification. Non-patent document 1 (USB Implementers Forum, Inc, "Battery Charging Specification Revision 1.2", Dec. 7, 2010, [online], and the Internet <URL:http://www.usb.org/developers/devclass_docs>, searched on Jan. 17, 2012) discloses an additional specification (Revision 1.2) with respect to USB 2.0 Specification. Moreover, Patent Document 1 (Japanese Patent. Laid-Open No. 2011-217513) discloses a battery charger for electronic devices compliant with USB Charging Specification (Revision 1.1) before being revised to 1.2.

SUMMARY

Note that, each disclosure of the above-described conventional arts is hereby incorporated by reference in its entirety. The following analysis has been made by the present inventors.

As described above, the additional specification has been formulated with respect to USB 2.0 Specification. In this specification, the additional specification disclosed in Non-patent document 1 is denoted as USB Battery Charging Specification 1.2 and will be described below. In USB Battery Charging Specification 1.2, a port defined as a CDP (Charging Downstream Port) and a port defined as a DCP (Dedicated Charging Port) are added.

In USB Battery Charging Specification 1.2, in order to allow for discrimination between these ports, differential signal lines D+ and D− need to be opened or short-circuited in accordance with the type of the port. More specifically, when a host operates as a CDP, the differential signal lines D+ and D− are opened (the both signal lines are not short-circuited). Moreover, when operating as a host DCP, the differential signal lines D+ and D− are short-circuited. In USB Battery Charging Specification 1.2, these specifications are specified.

Therefore, the present inventors have examined a circuit configuration for implementing the specification, and have conceived arranging a transfer gate between the differential signal lines D+ and D−. In contrast, a host, in confirming the mounting of a device, determines whether or not the potential of the differential signal line D+ (or differential signal line D−) has exceeded a threshold value. For example, when the potential of the differential signal line D+ is equal to or greater than a predetermined threshold value and also when the potential of the differential signal line D− is equal to the ground voltage, a host determines that the device has been mounted. In this case, there may be a voltage difference between the power voltage of both the device and the host. When this voltage difference is in the vicinity of the threshold voltage of a transistor included in the transfer gate, a leakage current might flow from the differential signal line D+ to the differential signal line D− even if the transfer gate is in an open state. Due to this leakage current and a resistor pulling down the differential signal line D−, the potential of the differential signal line D− may exceed the above-described threshold value. Then, both the potentials of the differential signal lines D+ and D− exceed the threshold value, and the host cannot recognize the mounting of a device. Therefore, a semiconductor device and a communication interface circuit, for preventing the recognition failure in the mutual recognition between a host and a device compliant with USB Specifications are desired.

Note that, the overview of the mutual recognition between a host and a device in USB Battery Charging Specification 1.2 and the details of a problem in this case will be described later. Moreover, other problems and new features will become clear from the description of this specification and the accompanying drawings.

According to an embodiment, a semiconductor device includes: an interterminal opening/closing section having a plurality of first conductivity type MOS transistors coupled in series; and a current bypass section that reduces a current flowing into a connection node included in the interterminal opening/closing section. The semiconductor device reduces a current flowing into the connection node when the interterminal opening/closing section is in an open state.

According to another embodiment, a communication interface circuit has the above-described semiconductor device arranged between terminals for receiving a differential signal.

According to an embodiment, a semiconductor device and a communication interface circuit, which prevent a recognition failure in the mutual recognition between a host and a device compliant with USB specifications, can be provided.

DETAILED DESCRIPTION

Figure 1:
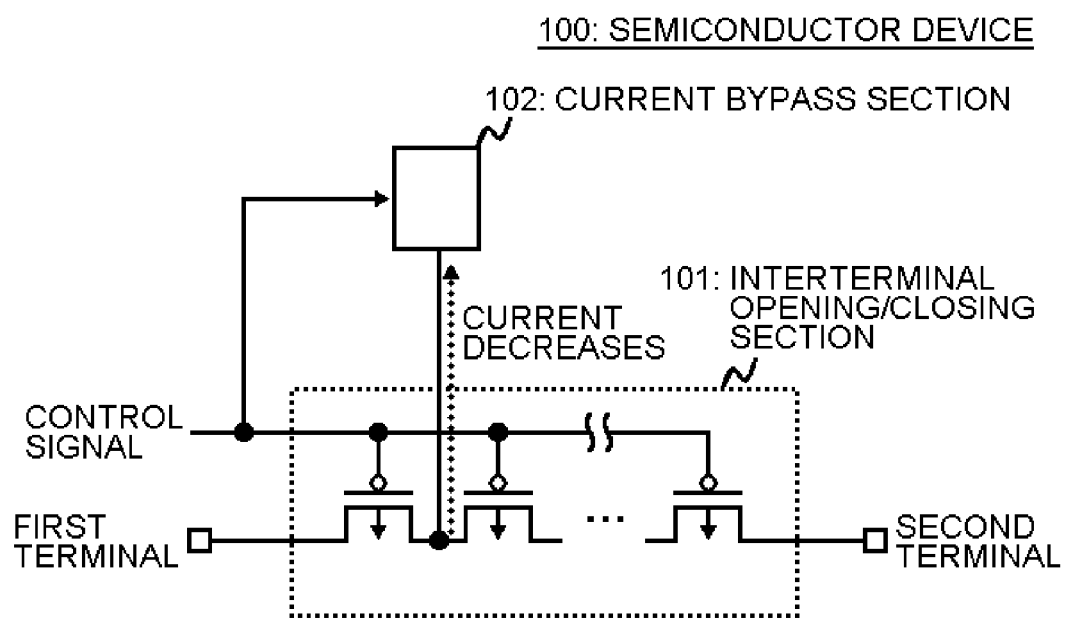
FIG. 1 is a view for illustrating the overview of an embodiment.

First, the overview of an embodiment will be described using FIG. 1. Note that, drawing reference numerals given in this overview are attached to the respective components for convenience as an example for helping understanding of the overview. The description of this overview is not intended to limit the present invention in any way.

As described above, in a host and a device compliant with USB Battery Charging Specification 1.2, if there exists a voltage difference between the power source voltages of both the host and the device, then despite the fact that the device has been mounted on the host, this state might not be able to be recognized. Therefore, there is desired a semiconductor device that prevents the recognition failure in the mutual recognition between a host and a device compliant with the USB specification.

Therefore, a semiconductor device 100 shown in FIG. 1 is provided as an example. The semiconductor device 100 shown in FIG. 1 includes: an interterminal opening/closing section 101 having the first conductivity type MOS transistors, the respective sources or drains of which are cascaded, in which the source or drain of a first-stage first conductivity type MOS transistor among the cascaded first conductivity type MOS transistors is used as a first terminal, in which the source or drain of a last-stage first conductivity type MOS transistor among the cascaded first conductivity type MOS transistors is used as a second terminal, and in which the respective gates of the cascaded first conductivity type MOS transistors receive a control signal for controlling the opening or short-circuiting between the first and second terminals; and a current bypass section 102 that reduces a current flowing into either one connection node coupling the respective sources or drains of the cascaded first conductivity type MOS transistors.

The semiconductor device 100 is used as a transfer gate arranged between the differential signal lines D+ and D− of a USB interface circuit. Moreover, the semiconductor device 100 can switch between the opening and short-circuiting of the interterminal opening/closing section 101 by receiving a control signal. In contrast, in a CDP of USB Battery Charging Specification 1.2, the differential signal lines D+ and D− need to be opened. Therefore, at the time of a CDP operation, the first conductivity type MOS transistors included in the interterminal opening/closing section 101 are set to an off-state. In this case, when there is generated a voltage difference in the operating voltage between a host and a device, a leakage current may be generated in the first conductivity type MOS transistor as described above. However, even in such a case, by the operation of the current bypass section 102, the current flowing into a node that mutually couples the first conductivity type MOS transistors decreases. Then, a current flowing out to the differential signal line, to which a power source voltage is not applied, can be reduced. As a result, an increase in the potential of the differential signal line, to which a power source voltage is not applied, can be suppressed, and a failure in recognizing a device can be prevented.

Furthermore, the following aspects are possible.

[Aspect 1]

A semiconductor device preferably includes: an interterminal opening/closing section having a plurality of first conductivity type MOS transistors, the respective sources or drains of which are cascaded, in which the source or drain of a first-stage first conductivity type MOS transistor among the cascaded first conductivity type MOS transistors is used as a first terminal, the source or drain of a last-stage first conductivity type MOS transistor among the cascaded first conductivity type MOS transistors is used as a second terminal, and the respective gates of the cascaded first conductivity type MOS transistors receive a control signal for controlling the opening or short-circuiting between the first and second terminals; and a current bypass section that reduces a current flowing into either one connection node coupling the respective sources or drains of the cascaded first conductivity type MOS transistors.

[Aspect 2]

The current bypass section preferably feeds a current, which flows into the connection node, to either a power supply line or a ground line.

[Aspect 3]

Preferably, the current bypass section includes a first conductivity type MOS transistor, the gate of which receives a signal obtained by inverting the logic of the control signal, or a second conductive MOS transistor, the gate of which receives the control signal.

[Aspect 4]

The semiconductor device preferably includes a first resistor, one end of which is coupled to the source or the drain of the first-stage first conductivity type MOS transistor and other end of which is used as the first terminal, and a second resistor, one end of which is coupled to the source or the drain of the last-stage first conductivity type MOS transistor and other end of which is used as the second terminal.

[Aspect 5]

The semiconductor device preferably includes a second conductive MOS transistor, the source or drain of which is coupled to the source or drain of the first-stage first conductivity type MOS transistor and other source or drain of which is coupled to the source or drain of the last-stage first conductivity type MOS transistor and the gate of which receives a signal obtained by inverting the logic of the control signal.

[Aspect 6]

Preferably, the backgates of the first conductivity type MOS transistors included in the interterminal opening/closing section and the backgate of a first conductivity type MOS transistor included in the current bypass section are mutually coupled.

[Aspect 7]

Preferably, a semiconductor device includes: a first P-channel type MOS transistor, the source or drain of which is used as a first terminal; a second P-channel type MOS transistor, the source or drain of which is coupled to the source or drain different from the first terminal and other source or drain of which is coupled is used as a second terminal; and a third P-channel type MOS transistor, the drain of which is coupled to a connection node between the first and second P-channel type MOS transistors and the source of which receives a power source voltage. Preferably, the back-gates of the first to third P-channel type MOS transistors are coupled to the power source voltage, and the gates of the first and second P-channel type MOS transistors receive a control signal for controlling the opening or short-circuiting between the first and second terminals, and the gate of the third P-channel type MOS transistor receives a signal obtained by inverting the logic of the control signal.

[Aspect 8]

Preferably, a communication interface circuit includes the above-described semiconductor device, couples the first terminal to a terminal for receiving one of differential signals, and couples the second terminal to a terminal for receiving the other differential signal.

[Aspect 9]

Preferably, the communication interface circuit complies with USB (Universal Serial Bus) Specifications and transmits/receives data.

Next, an overview of the mutual recognition between a host and a device in USB Battery Charging Specification 1.2 and the problem in this case will be described.

As described above, a new additional specification has been formulated with respect to USB 2.0 Specification. This additional specification mainly specifies the battery charging specification on the device side and describes a method of acquiring an electric power from a USB port on the host side. USB Battery Charging Specification 1.2 defines three types of ports.

A first port is defined as an SDP (Standard Downstream Port). The SDP is the same port as that defined by USB 2.0 Specification. The upper limit of the power supply capability in the SDP is 5 V/500 mA.

A second port is defined as a CDP. The CDP is the port newly defined in USB Battery Charging Specification 1.2. The upper limit of the power supply capability in the CDP is 5 V/1.5 A. In the CDP, data communication between a host and a device is possible along with the battery charging of a device.

A third port is defined as a DCP. The DCP is also the port newly defined in USB Battery Charging Specification 1.2. The upper limit of the power supply capability in the DCP is also 5 V/1.5 A. However, different from the CDP, the data communication between a host and a device cannot be performed. The DCP does not use the data communication, and is prepared to realize an AC adapter or the like, specific to the battery charging of a device.

Here, in USB Battery Charging Specification 1.2, there is specified a specification for determining, by the device side, at which port of an SDP, a CDP and a DCP, a host is operating. This is because if the device side cannot determine whether or not a host complies with USB Battery Charging Specification 1.2, it cannot determine whether or not a high current (1.5 A) can be drawn. Furthermore, if the device side cannot determine at which port of a CDP or a DCP, a host operates, it also cannot determine whether or not emulation (exchange of the configuration information of a USB device) is needed.

Note that, which of the three types of ports is to be used is determined by the host side. For example, if a host compliant with USB Battery Charging Specification 1.2 is a personal computer, an interface, with which a user can determine the setting of each port in advance, is prepared, and in accordance with this setting either one of the three types of ports is determined.

Hereinafter, the method of distinguishing between ports in USB Battery Charging Specification 1.2 is outlined.

As described above, in USB Battery Charging Specification 1.2, in order to distinguish between a CDP and a DCP, the opening and short-circuiting between the differential signal line D+ and D− need to be achieved on the host side. Therefore, the present inventors have examined the circuit configuration for implementing this specification.

Figure 2:
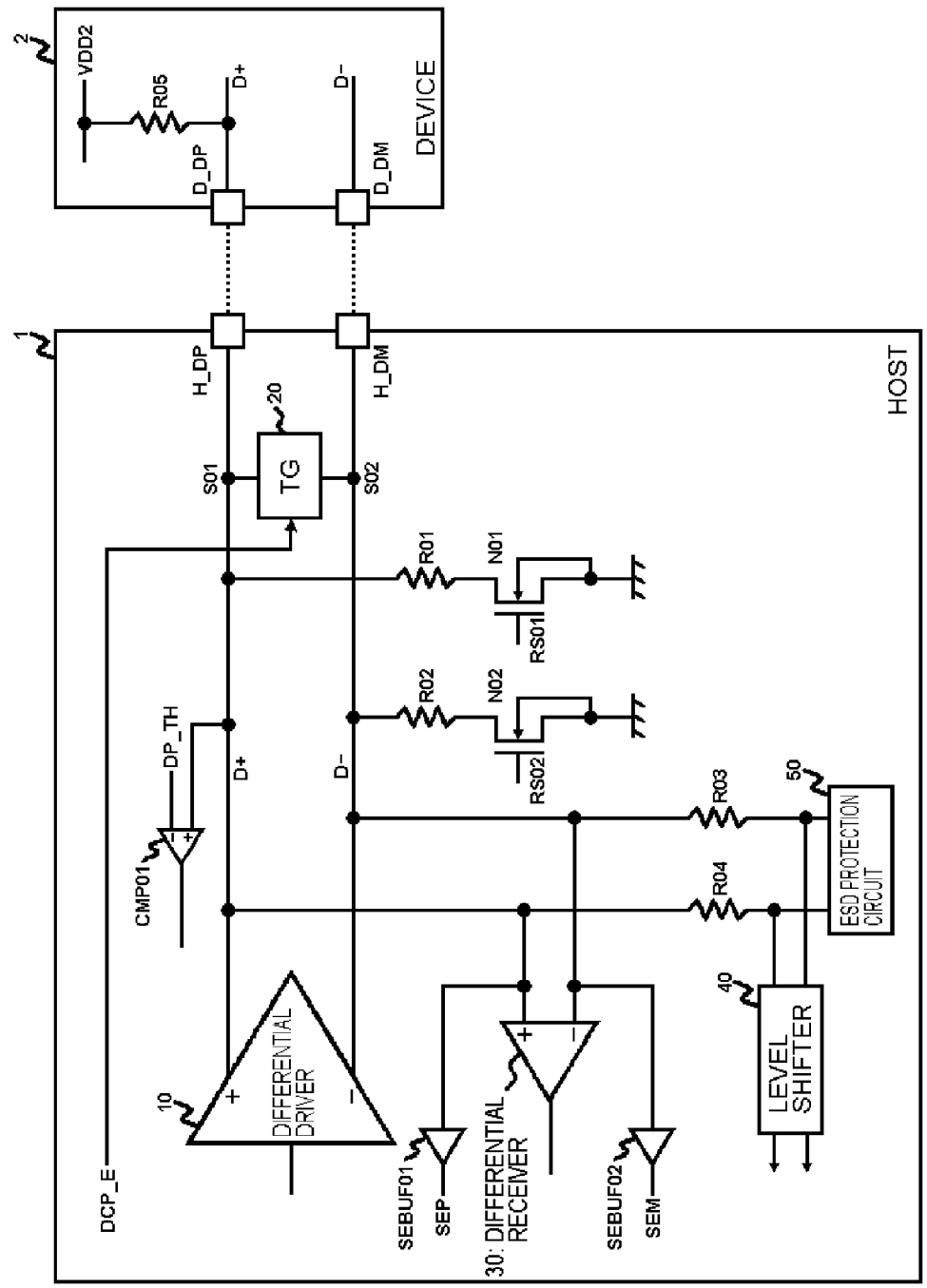
FIG. 2 is a view showing an example of a USB physical layer in a host and a device.

FIG. 2 is a view showing an example of a USB physical layer in a host and a device.

A host 1 and a device 2 compliant with USB Battery Charging. Specification 1.2 are included in the physical layer shown FIG. 2.

The host 1 includes a differential driver 10, a transfer gate 20, a differential receiver 30, a level shifter 40, an ESD (ElectroStatic Discharge) protection circuit 50, single-ended receivers SEBUF01 and SEBUF02, a comparator CMP01, resistors R01-R04, and N-channel type MOS transistors N01 and N02.

The differential driver 10 converts a single-ended signal generated in an internal circuit (not shown) into a differential signal, and outputs the same to the differential signal lines D+ and D−. The differential signal line D+ is coupled to an input/output terminal H_DP. Similarly, the differential signal line D− is coupled to an input/output terminal H_DM.

The transfer gate 20 is coupled to the differential signal lines D+ and D−, respectively. Note that the following description will be given by defining a connection node between the differential signal line D+ and the transfer gate as a node S01 and a connection node between the differential signal line D− and the transfer gate 20 as a node S02, respectively. The transfer gate 20 receives a control signal DCP_E. The transfer gate 20 controls the opening and short-circuiting between the differential signal lines D+ and D− in response to the control signal DCP_E.

Figure 3:
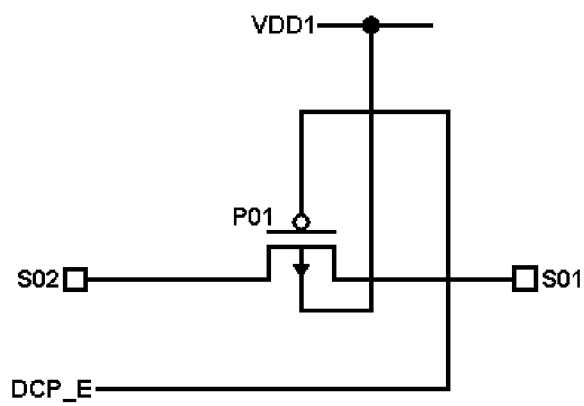
FIG. 3 is a view showing an example of the circuit configuration of a transfer gate 20 shown in FIG. 2.

FIG. 3 is a view showing an example of the circuit configuration of the transfer gate 20 shown in FIG. 3. As shown in FIG. 3, the transfer gate 20 is constituted by a P-channel type MOS transistor P01. The source or drain of the P-channel type MOS transistor P01 is coupled to the node S01 or S02, and the P-channel type MOS transistor P01 receives the control signal DCP_E at the gate thereof. Furthermore, the back-gate of the P-channel type MOS transistor P01 is coupled to a power source voltage VDD1 of the host 1.

The differential signal line D+ and the differential signal line D− are grounded via the resistors R01 and R02 and the N-channel type MOS transistors N01 and N02 (see FIG. 2). The N-channel type MOS transistors N01 and N02 receive disconnection indication signals RS01 and RS02, which an internal circuit outputs, at their gates, respectively. The resistor disconnection indication signals RS01 and RS02 are used in disabling the resistors R01 and R02 during a test mode or the like.

The differential receiver 30 receives a differential signal, which the device 2 transmits, via the differential signal lines D+ and D− and converts the same into a single-ended signal and subsequently outputs the resulting signal to an internal circuit.

The level shifter 40 is coupled to the differential signal lines D+ and D− via resistors R03 and R04, and converts the voltage of a signal propagating through the differential signal lines D+ and D−. Moreover, by installing the ESD protection circuit 50, the internal circuit and the like are protected from an ESD discharge entering from the input/output terminals H_DP and H_DM.

The single-ended receiver SEBUF01 has set therein a voltage SE_TH for determining whether or not the voltage of the differential signal line D+ is higher than a predetermined threshold value. The single-ended receiver SEBUF01 outputs an H-level when the voltage of the differential signal line D+ is higher than the voltage SE_TH. Similarly, the single-ended receiver SEBUF02 outputs an H-level when the voltage of the differential signal line D− is higher than the voltage SE_TH. A signal the single-ended receiver SEBUF01 outputs is referred to as a SEP signal, and a signal the single-ended receiver SEBUF02 outputs is referred to as a SEM signal. The comparator CMP01 receives the voltage of the differential signal line D+ at the non-inverting input terminal thereof, and receives the voltage DP_TH at the inverting input terminal thereof. The comparator CMP01 outputs an H-level when the voltage of the differential signal line D+ is higher than the voltage DP_TH. Note that, the voltage DP_TH and the voltage SE_TH will be described later.

The device 2 transmits/receives the differential signal to/from the host 1 via the input/output terminals D_DP and D_DM. Moreover, the differential signal line D+ of the device 2 is pulled up to a power source voltage VDD2 via a resistor R05. Note that, in FIG. 2, disclosed is an example in which the differential signal line D+ of the device 2 is pulled up, but the differential signal line D− may be pulled up. That is, either the differential signal line D+ or D− of the device 2 may be pulled up.

The mutual recognition between the host 1 and the device 2 starts by electrical coupling the input/output terminals H_DP and H_DM of the host 1 to the input/output terminals D_DP and D_DM of the device 2.

Next, the mutual recognition when the host 1 operates as a CDP will be described.

Figure 4:
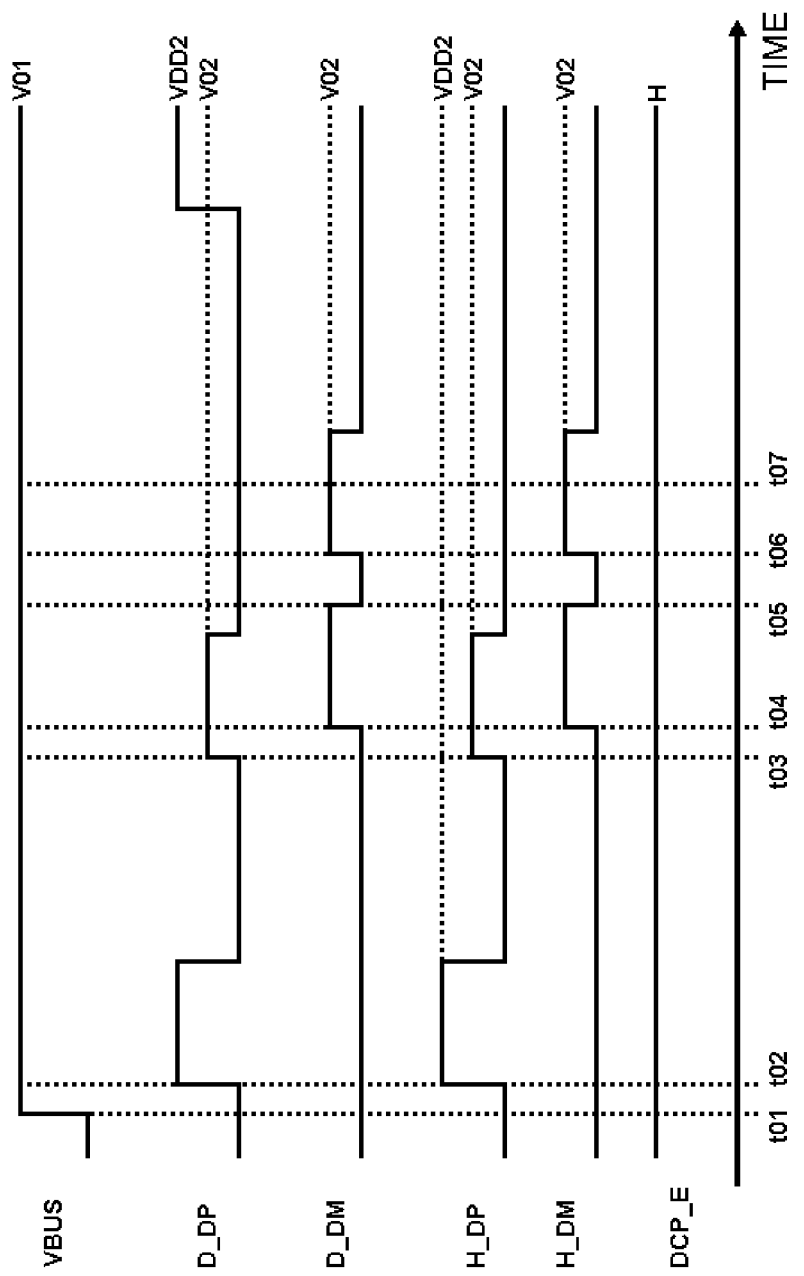
FIG. 4 is a view showing an example of the state of each terminal of a host 1 and a device 2 in the mutual recognition at the time of a CDP.

FIG. 4 is a view showing an example of the state of each terminal of the host 1 and the device 2 in the mutual recognition at the time of a CDP.

In response to the fact that the device 2 is mounted on the host 1, the voltage of a VBUS terminal of the device 2 rises to a voltage V01 (e.g., 5.0 V) (at a time t01). Furthermore, because the differential signal line D+ of the device 2 is pulled up to the power source voltage VDD2, the potential of the differential signal line. D+ of the host 1 is also set to the power source voltage VDD2 (at a time t02).

When the potential of the input/output terminal H_DP is pulled up to the power source voltage VDD2, the single-ended receiver SEBUF01 included in the host 1 sets the SEP signal to an H-level and outputs the same. That is, the voltage SE_TH is a threshold voltage for detecting the fact that the potential of the input/output terminal H_DP has been pulled up to the power source voltage VDD2. Here, the potential of the input/output terminal H_DM maintains the ground voltage. Accordingly, the SEM signal which the single-ended receiver SEBUF02 outputs is at an L-level. When the host 1 detects that the SEP signal is at an H-level and the SEM signal is at an L-level, the host 1 recognizes that the device 2 has been coupled. Otherwise, when the differential signal line D− of the device 2 is pulled up, once detecting that the SEP signal is at an L-level and the SEM signal is at an H-level, the host 1 recognizes that the device 2 has been coupled. Note that the following description is based on the premise that the differential signal line D+ of the device 2 is pulled up.

Subsequently, the device 2 sets the input/output terminal D_DP to the voltage V02 (at a time t03). The device 2 notifies the host 1 of the fact that device 2 itself is a device compliant with USB Battery Charging Specification 1.2 by setting the input/output terminal D_DP to the voltage V02. Note that, in USB Battery Charging Specification 1.2, the voltage V02 is specified to be in the range from 0.5 V to 0.7 V.

When the potential of the input/output terminal H_DP is set to the voltage V02, the comparator CMP01 included in the host 1 outputs an H-level. That is, the voltage DP_TH is assumed to be set to a voltage (a voltage in consideration of a margin) slightly lower than the voltage V02.

An internal circuit included in the host 1 recognizes that a device compliant with USB Battery Charging Specification 1.2 has been coupled, by the fact that the output of the comparator CMP01 becomes an H-level. Subsequently, the host 1 sets the voltage of the input/output terminal H_DM to the voltage V02 (at a time t04). Then, the host 1 sets this voltage to the ground voltage after a predetermined time (at a time t05).

The host 1 notifies the device 2 of the fact that the host 1 itself is a host compliant with USB Battery Charging Specification 1.2, by setting the input/output terminal H_DM to the voltage V02.

The device 2 sets the input/output terminal D_DM to the voltage V02 after detecting the fact that the host 1 has set the input/output terminal H_DM to the voltage V02 (time t06). Subsequently, the device 2 confirms the potential of the input/output terminal D_DP (time t07). At that time, while the host 1 is operating as a CDP, the transfer gate 20 is being set to an open state (the differential signal lines D+ and D− are opened) (the control signal DCP_E is being set to an H-level). Then, the potentials of the input/output terminals H_DM and D_DM and the potential of the input/output terminal D_DP (differential signal line D+) never agree with each other. Accordingly, in confirming the potential of the input/output terminal D_DP at a time t07, if this potential is equal to the ground voltage, the device 2 can recognize that the host 1 is operating as a CDP.

Figure 5:
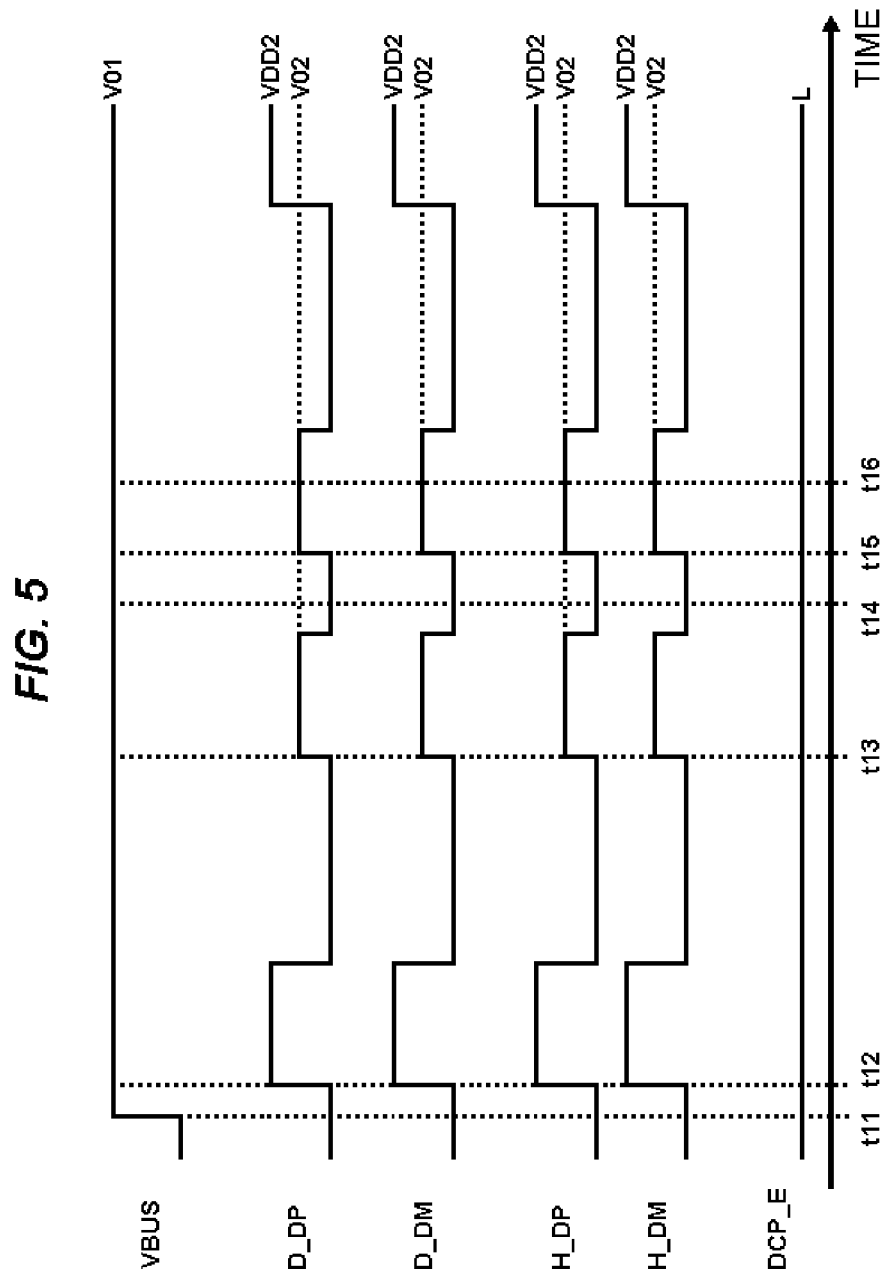
FIG. 5 is a view showing an example of the state of each terminal of the host 1 and the device 2 in the mutual recognition at the time of a DCP.

FIG. 5 is a view showing an example of the state of each terminal of the host 1 and the device 2 in the mutual recognition at the time of a DCP. When the host 1 operates as a DCP, the control signal DCP_E is set to an L-level. Then, because the transfer gate 20 is in a close state (the differential signal lines D+ and D− are short-circuited), the potentials of the input/output terminals H_DM and D_DM and the potential of the input/output terminal D_DP (differential signal line D+) agree with each other. Accordingly, in confirming the potential of the input/output terminal D_DP at a time t16, if this potential is equal to the voltage V02, the device 2 can recognize that the host 1 is operating as a DCP. Note that, when the host 1 operates as a DCP, the SEP signal and the SEM signal are not monitored. That is, the operation of detecting the device 2 is not performed.

The above is the overview of the mutual recognition in a host and a device compliant with USB Battery Charging Specification 1.2.

Figure 6:
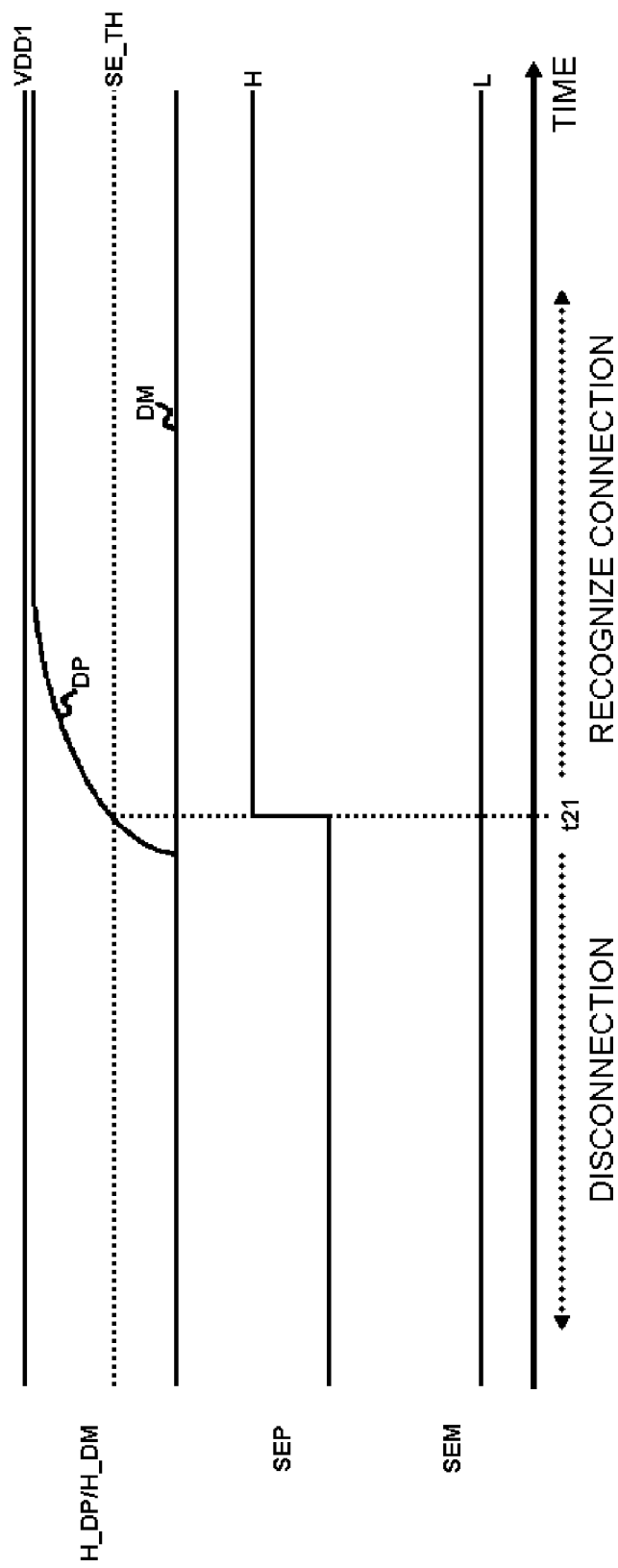
FIG. 6 is an enlarged view of the waveforms when the host 1 successfully recognizes the coupling of the device 2.

FIG. 6 is an enlarged view of the waveforms when the host 1 successfully recognizes the coupling of the device 2. As described above, the host 1 recognizes that the device 2 has been coupled, by the SEP signal being set to an H-level and the SEM signal being set to an L-level. That is, when the port of the host 1 is a CDP, the SEP signal is set to an H-level and the SEM signal is set to an L-level, and thus the host 1 can recognize the mounting of the device 2.

However, when the host 1 complies with USB Battery Charging Specification 1.2, a situation may be contemplated in which the host 1 cannot recognize the device 2. That is, when the differential signal lines D+ and D− are opened, a situation in which the host 1 cannot recognize the device 2 may be contemplated.

Here, for the power source voltages of the host 1 and the device 2, the upper limit and the lower limit thereof are specified in USB 2.0 Specification. Accordingly, as long as the power source voltages of the host 1 and the device 2 are within this range, they do not violate the specification. Then, it is assumed that the power source voltage VDD1 of the host 1 is equal to the lower limit and the power source voltage VDD2 of the device 2 is equal to the upper limit. Moreover, when the host 1 recognizes the device 2 (at the time t02 in FIG. 4 and at a time t12 in FIG. 5), the transfer gate 20 is in an open state.

Since the transfer gate 20 is in an open state, essentially a current does not flow from the differential signal line D+ toward the differential signal line D− via the transfer gate 20. However, since there is caused a voltage difference between the power source voltage VDD1 of the host 1 and the power source voltage VDD2 of the device 2, a leakage current flows into the P-channel type MOS transistor P01 included in the transfer gate 20. That is, a current flows from the node S01 toward the node S02.

More specifically, if the power source voltage VDD1 of the host 1=3.0 V and the power source voltage VDD2 of the device 2=3.6 V, the voltage difference is 0.6 V. Accordingly, depending on the threshold voltage of the P-channel type MOS transistor P01, the P-channel type MOS transistor P01 cannot be set to a complete off-state. Therefore, a leakage current is generated in the P-channel type MOS transistor P01.

Moreover, the differential signal line D− is pulled down via the resistor R02, and thus a leakage current flowing in via the P-channel type MOS transistor P01 flows through the resistor R02. As a result, the potential of the node S02 rises. When the potential (the input voltage of the single-ended receiver SEBUF02) of the node S02 exceeds the voltage SE_TH, the single-ended receiver SEBUF02 outputs the SEM signal at an H-level.

Figure 7:
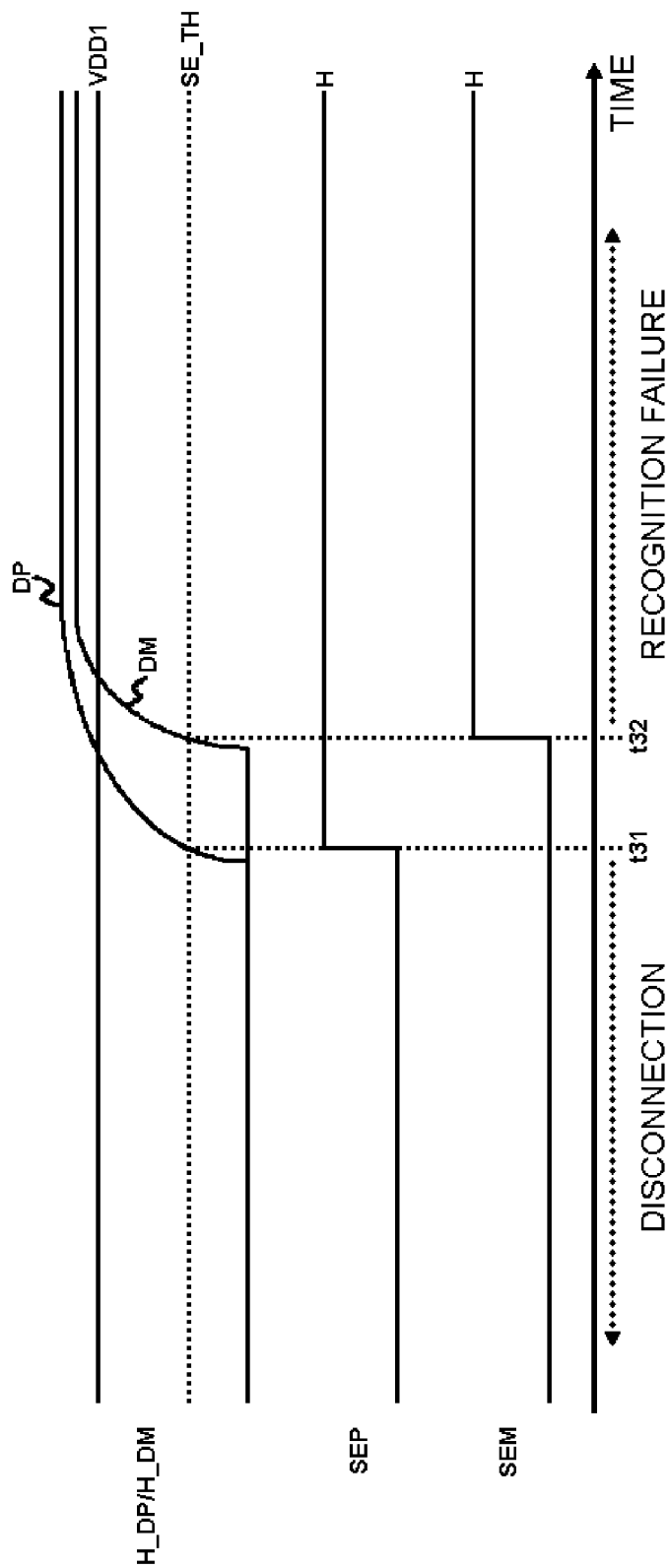
FIG. 7 shows an example of the waveforms when the host 1 recognizes the coupling of the device 2.

FIG. 7 shows an example of the waveforms when the host 1 recognizes the coupling of the device 2. As shown in FIG. 7, when the input voltage of the single-ended receiver SEBUF02 exceeds the voltage SE_TH, the SEM signal is set to an H-level (at a time t32). As described above, the host 1 can detect the coupling of the device 2 when the SEP signal is being set to an H-level and the SEM signal is being set to an L-level, and thus, with the waveforms as shown in FIG. 7, the host 1 cannot successfully recognize the coupling of the device 2. That is, a failure in recognizing the device 2 occurs.

Hereinafter, specific embodiments will be described in more detail with reference to the accompanying drawings.

First Embodiment

A first embodiment will be described in more detail with reference to a drawing.

The difference between a host 3 according to the embodiment and the host 1 already described is in that the transfer gate 20 shown in FIG. 2 is replaced with a transfer gate 21. Therefore, the description of the host 3 corresponding to the description of FIG. 2 is omitted.

Figures 8, 9:
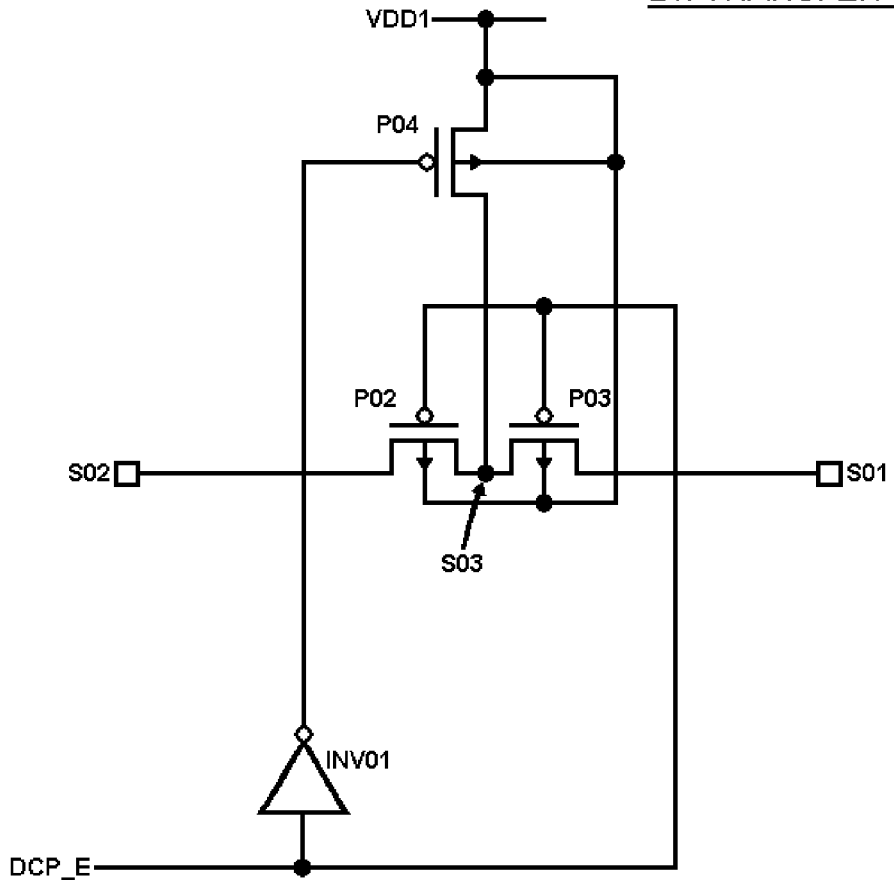
FIG. 8 is a view showing an example of the circuit configuration of a transfer gate 21 according to a first embodiment.
FIG. 9 is a view for summarizing the states of a control signal DCP_E and a transfer gate 21.

FIG. 8 is a view showing an example of the circuit configuration of the transfer gate 21 according to the first embodiment. The transfer gate 21 includes P-channel type MOS transistors P02-P04 and an inverter circuit INV01.

The source or drain of the P-channel type MOS transistor P02 is coupled to the node S02, and other source or drain is coupled to the source or drain of the P-channel type MOS transistor P03. Furthermore, the source or drain of the P-channel type MOS transistor P03 is coupled to the node S01. The gates of the P-channel type MOS transistors P02 and the P03 receive the control signal DCP_E. Note that, with the connection node between the P-channel type MOS transistors P02 and P03 being denoted as a node S03, the following descriptions is given. The P-channel type MOS transistors P02 and P03 correspond to the interterminal opening/closing section 101 described above.

The source of the P-channel type MOS transistor P04 is coupled to the power source voltage VDD1, the drain thereof is coupled to the node S03, and the gate thereof receives the control signal DCP_E inverted by the inverter circuit INV01. The P-channel type MOS transistor P04 corresponds to the current bypass section 102 described above.

The backgates of the P-channel type MOS transistors P02 to P04 are mutually coupled to the power source voltage VDD1. Note that the backgates of the P-channel type MOS transistors P02-P04 are not limited to being mutually coupled. These backgates may be individually coupled to the power source voltage VDD1.

The transfer gate 21 when the control signal DCP_E is at an L-level, short-circuits the nodes S01 and S02. That is, the interterminal opening/closing section constituted by the P-channel type MOS transistors P02 and P03 short-circuits the differential signal lines D+ and D−. At that time, the P-channel type MOS transistor P04 is in an off-state, and thus a current does not flow from the node S03 toward the power source voltage VDD1.

In contrast, the transfer gate 21, when the control signal DCP_E is at an H-level, opens the nodes S01 and S02. In this case, the P-channel type MOS transistor P04 is in an on-state, so a current path from the node S03 toward the power source voltage VDD can be formed. FIG. 9 is a view for summarizing the states of the control signal DCP_E and the transfer gate 21.

Next, the operation of the host 3 including the transfer gate 21 will be described.

At that time, it is assumed that the host 3 operates as a CDP. The host 3, in order to operate as a CDP, always sets the control signal DCP_E to an H-level and sets the transfer gate 21 to an open state. Moreover, since the control signal DCP_E is at an H-level, the P-channel type MOS transistor P04 is in an on-state. When the device 2 is coupled to the host 3, the potential of the input/output terminal H_DP of the host 3 increases, and at a time point when it exceeds the voltage SE_TH, the SEP signal becomes an H-level. In this case, if a voltage equal to or greater than the power source voltage of the host 3 is applied to the input/output terminal H_DP, a leakage current flows into the node S03 via the P-channel type MOS transistor P03 included in the transfer gate 21.

However, since the P-channel type MOS transistor P04 arranged between the node S03 and the power source voltage VDD is in an on-state, most of the current flowing into the node S03 flows to the power supply line via the P-channel type MOS transistor P04. As a result, the current flowing into the input/output terminal H_DM via the P-channel type MOS transistor P02 can be suppressed.

The current flowing into the input/output terminal H_DM decreases, and thus an increase in the potential of the input/output terminal H_DM (differential signal line D−) can be suppressed. Therefore, the input voltage to the single-ended receiver SEBUF02 does not exceed the voltage SE_TH and the SEM signal is maintained at an L-level. That is, in the host 3 according to the embodiment, a failure in recognizing the device 2 does not occur.

Here, as a measure for preventing a failure in recognizing the device 2, the following measures can be contemplated.

A first measure is to increase the threshold voltage of the P-channel type MOS transistor P01 included in the transfer gate 20. The current value of a current flowing into the input/output terminal H_DM via the P-channel type MOS transistor P01 depends on a difference between the power source voltage VDD1 of the host 1 and the power source voltage VDD2 of the device 2, and depends on the threshold voltage of the P-channel type MOS transistor P01. Therefore, the generation of a leakage current can be suppressed by increasing the threshold voltage of the P-channel type MOS transistor P01.

However, in such a countermeasure, a modification such as formation of the gate oxide film of the P-channel type MOS transistor P01 so as to be thicker than the gate oxide film of other P-channel type MOS transistors included in the host 1, is needed. That is, a P-channel type MOS transistor with a high threshold voltage needs to be specially prepared, which poses a problem in terms of effective use of the substrate area.

In contrast, for the P-channel type MOS transistors P02-P04 used for the transfer gate 21 according to the embodiment, the threshold voltage thereof does not need to be increased as compared with other P-channel type MOS transistors, and thus such a problem does not occur.

A second measure is to employ a configuration in which a plurality of P-channel type MOS transistors is cascaded.

Figure 10:
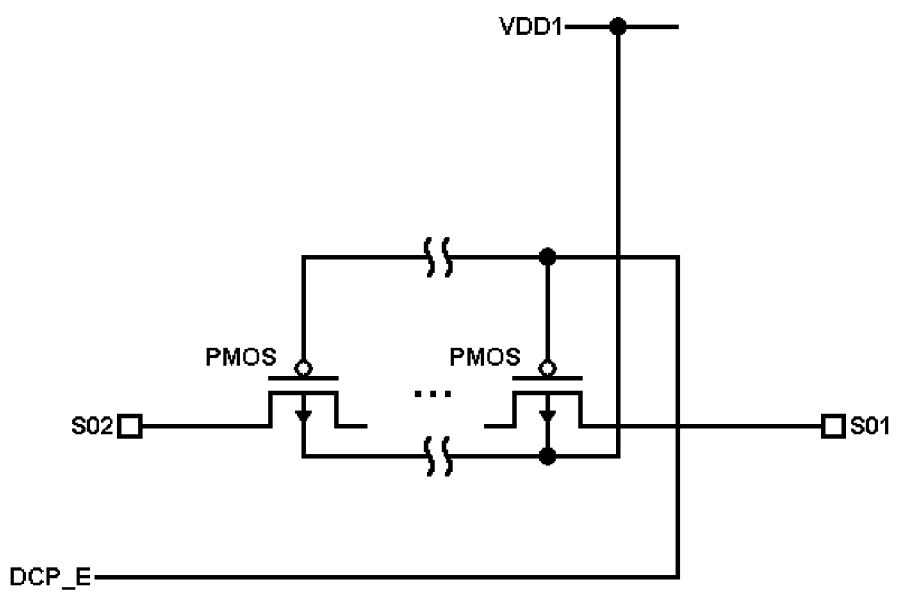
FIG. 10 is a view showing an example of the circuit configuration of a transfer gate 20*a*.

FIG. 10 is a view showing an example of the circuit configuration of a transfer gate 20a. As shown in FIG. 10, by cascading the P-channel type MOS transistors, a current flowing into the input/output terminal H_DM can be reduced. However, in such a countermeasure, a number of P-channel type MOS transistors are needed, and problems, such as an increase of the substrate area and an increase of the cost, occur. In contrast, the number of P-channel type MOS transistors used for the transfer gate 21 according to the embodiment is limited, and the substrate area does not increase.

In the present embodiment, a case where a host and a device are coupled to each other, and the prevention of the recognition failure that the host cannot recognize the device have been described. However, even when a USB hub and a device are coupled to each other, needless to say that a failure in recognizing the device in the USB hub can be prevented. Accordingly, the transfer gate 21 according to the embodiment is suitably applied to a host controller or a HUB controller compliant with USB 2.0 Specification (including USB Specification Revision 1.1). Moreover, at present, USB Specifications have been determined up to Revision 3.0, but in USB Specification Revision 3.0, the battery charging specification at high electric power of such as 1.5 A has not been specified yet. For this reason, even in a host controller or the like compliant with USB 3.0, fast battery charging in accordance with USB Battery Charging Specification 1.2 is planned. Accordingly, even if the transfer gate 21 according to the embodiment is used for a host controller or a HUB controller compliant with USB 3.0, the same effect can be expected.

Furthermore, all the transistors included in the transfer gate 21 are P-channel type MOS transistors, but are not limiting. For example, in place of the P-channel type MOS transistor P04, an N-channel type MOS transistor may be arranged. This is because even with an N-channel type MOS transistor, a current can be fed from the node S03 to the ground line. However, the use of an N-channel type MOS transistor results in a higher current flowing into the ground line, and there is a concern that the power source voltage VDD1 drops due to the influence of the on-resistance of the N-channel type MOS transistor. Therefore, as described in the embodiment, all the transistors included in the transfer gate 21 are preferably unified by either P-channel type MOS transistors or N-channel type MOS transistors. This is because if unified by either of them, the current value of a current flowing out of the node S03 is limited (because the current value of a current flowing from the node S03 depends on a difference between the power source voltage VDD1 and the power source voltage VDD2).

Furthermore, a measure for reducing the current flowing into the node S03 is not limited to feeding a current into the power supply line or the ground line by turning on/off a transistor. For example, the current flowing into the node S03 can be reduced by coupling one end of a capacitive element to the node S03 and thereby absorbing the current flowing into the node S03. In this case, the charge stored in the capacitive element may be discharged during an operation mode that does not affect the operations of a host and a device.

As described above, in the mutual recognition between a host and a device compliant with USB Battery Charging Specification 1.2, a problem occurs such as that the host cannot successfully recognize the device due to an increase in the potential of the input/output terminal H_DM (differential signal line D−). Then, the transfer gate 21 constituted by the P-channel type MOS transistors P02-P04 is used. The transfer gate 21 sets the P-channel type MOS transistor P04 to an on-state when the node S01 and S02 are opened. By setting the P-channel type MOS transistor P04 to an on-state, even when there is a voltage difference between the power source voltage VDD1 of a host and the power source voltage VDD2 of a device, the generated leakage current is absorbed by the power supply via the P-channel type MOS transistor P04. As a result, the current flowing into the input/output terminal H_DM decreases, and the voltage the single-ended receiver SEBUF02 receives does not rise. That is, the single-ended receiver SEBUF02 does not output an H-level as the SEM signal, and thus a failure in recognizing the device can be prevented.

Second Embodiment

Subsequently, a second embodiment will be described in detail with reference to the drawing.

The transfer gate 21 according to the first embodiment is coupled to the input/output terminals H_DP and to the H_DM without via a resistor. Therefore, the transfer gate 21 may be susceptible to ESD discharge. Accordingly, an increase of the resistance of the transfer gate 21 against ESD discharge is desired.

Figure 11:
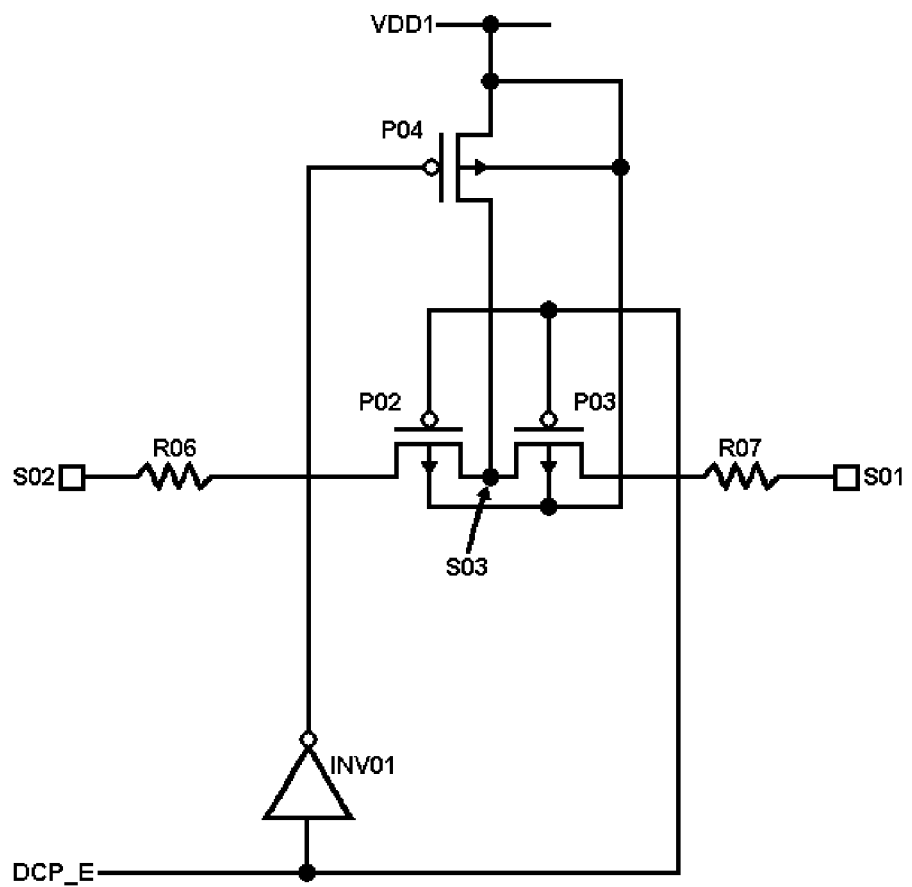
FIG. 11 is a view showing an example of the circuit configuration of a transfer gate 22 according to a second embodiment.

FIG. 11 is a view showing an example of the circuit configuration of a transfer gate 22 according to the second embodiment. In FIG. 11, the same symbol is attached to the same component as that of FIG. 8, and the description thereof is omitted.

The difference between the transfer gate 21 and the transfer gate 22 is in that a resistor R06 is coupled between the P-channel type MOS transistor P03 and the nodes S01 and a resistor R07 is coupled between the P-channel type MOS transistor P02 and the nodes S02, respectively. Note that the resistance values of the resistors R06 and R07 are determined within a range in which the resistance value from the node S01 to the node S02 (the resistance values of the resistors R06 and R07 and the on-resistances of the P-channel type MOS transistors P02 and P03) does not depart from a specification determined by USB Battery Charging Specification 1.2.

As described above, in order to overcome the susceptibility of the transfer gate 21 against ESD discharge, the resistors R06 and R07 are coupled. As a result, the resistance of the transfer gate 22 and the resistance of a host including the transfer gate 22 against ESD discharge are improved.

Third Embodiment

Subsequently, a third embodiment will be described in detail with reference to the drawing.

As described above, in the mutual recognition between a host and a device, when the host operates as a DCP, the differential signal lines D+ and D− are short-circuited. Because the differential signal lines D+ and D− are short-circuited, the device can recognize that the host operates as a DCP. In this case, in the transfer gate, the voltage V02 that is a low voltage needs to be passed therethrough. Note that, as described above, in USB Battery Charging Specification 1.2, the voltage V02 is specified as 0.5 V to 0.7 V.

Therefore, in the transfer gate 21 or 22 constituted only by P-channel type MOS transistors, it is difficult to cause the voltage V02 to pass therethrough. This is because in order for a P-channel type MOS transistor to be turned on, the gate voltage needs to exceed the threshold voltage with reference to the source voltage.

Figure 12:
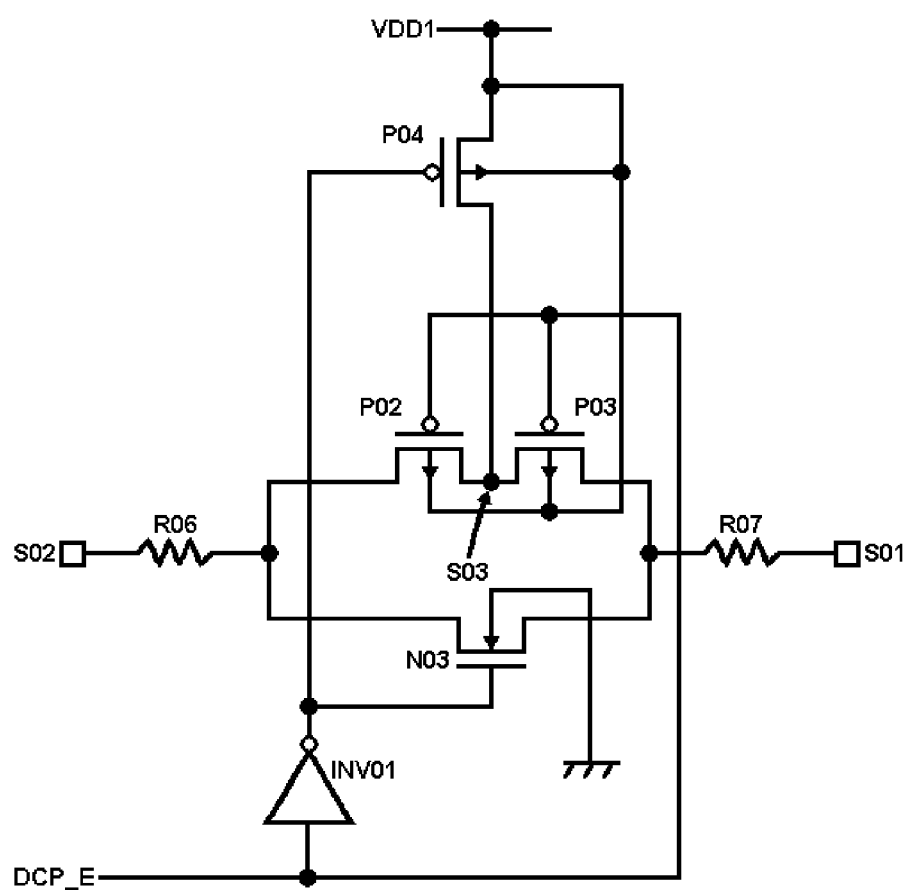
FIG. 12 is a view showing an example of the circuit configuration of a transfer gate 23 according to a third embodiment.

FIG. 12 is a view showing an example of the circuit configuration of a transfer gate 23 according to a third embodiment. In FIG. 12, the same symbol is attached to the same component as that of FIG. 11, and the description thereof is omitted.

The difference between the transfer gate 23 and the transfer gate 22 is in that an N-channel type MOS transistor N03 is added. The source or drain of the N-channel type MOS transistor N03 is coupled to the resistor R06, and other source or drain is coupled to the resistor R07. Furthermore, the gate of the N-channel type MOS transistor N03 receives the output of the inverter circuit INV01, and the backgate thereof is grounded.

In this manner, adding the N-channel type MOS transistor N03 to the transfer gate 22 facilitates a low voltages signal to pass through the transfer gate 22. This is because the passing through of a low voltage signal is easy because an N-channel type MOS transistor is turned on when the gate voltage exceeds the threshold voltage with reference to the source voltage.

Note that, in the transfer gate 23 according to the embodiment, an N-channel type MOS transistor is added to the transfer gate 22 according to the second embodiment. However, an N-channel type MOS transistor may be added to the transfer gate 21 according to the first embodiment. Also in such a case, the effect of easily causing a low voltages signal to pass through the transfer gate 21 can be expected.

Here, in the first to third embodiments, the description is given assuming that the transistor included in the transfer gate is a P-channel type MOS transistor. However, even if the P-channel type MOS transistor is interchanged with an N-channel type MOS transistor, the transfer gate can accordingly work if the couplings of the power supply and the like are arbitrarily modified. That is, the P-channel type MOS transistor can be regarded as the first conductivity type MOS transistor, and the N-channel type MOS transistor can be regarded as the second conductive MOS transistor. Furthermore, the use of the transfer gates 21-23 for a communication interface circuit compliant with USB Specifications has been described, but not limited to the USB Specifications, and needless to say that the transfer gates 21-23 can be applied to telecommunication specifications, in which the mutual recognition between a host and a device is carried out by the same procedure.

Note that, each disclosure of the Patent Documents and the like cited above is hereby incorporated by reference in its entirety. Within the scope of all disclosures (including the scope of the claims) of the present invention, and furthermore, on the basis of their basic technical ideas, modification and adjustment of the embodiments and/or the examples are possible. Moreover, within the scope of the claims of the present invention, a variety of combinations and/or selections of the various disclosed components (including each component of each claim, each component of each embodiment and/or an example, each component of each drawing, and the like) are possible. That is, it is needless to say that the present invention includes various kinds of variants and corrections, which those skilled in the art may make in accordance with all the disclosures and technical ideas including the claims.

What is claimed is:

1. A semiconductor device, comprising:
    an interterminal opening/closing section having a plurality of first conductivity type MOS transistors, the respective sources or drains of which are cascaded,
    wherein a source or drain of a first-stage first conductivity type MOS transistor among the cascaded first conductivity type MOS transistors is used as a first terminal,
    wherein a source or drain of a last-stage first conductivity type MOS transistor among the cascaded first conductivity type MOS transistors is used as a second terminal, and
    wherein the respective gates of the cascaded first conductivity type MOS transistors receive a control signal for controlling an opening or short-circuiting between the first and second terminals, and
    a current bypass section that reduces a current flowing into a connection node coupling the respective sources or drains of the cascaded first conductivity type MOS transistors with each other,
    wherein said first and second terminals are coupled to respective first and second differential signal lines each connected to a respective one of a pair of input/output terminals of a host,
    wherein said semiconductor device further comprises a first single-ended receiver constructed to output a first signal based on whether or not a voltage present at said first differential signal line exceeds a threshold voltage, and a second single-ended receiver constructed to output a second signal based on whether or not a voltage present at said second differential signal line exceeds said threshold voltage, and
    wherein said host is configured to determine that a device has been coupled to said pair of input/output terminals of the host based on said first and second signals having different states.

2. The semiconductor device according to claim 1, wherein the current bypass section feeds a current that flows into the connection node from either a power supply line or a ground line.

3. The semiconductor device according to claim 2, wherein it is configured such that the current bypass section includes a first conductivity type MOS transistor that receives, by the gate thereof, a signal obtained by inverting a logic state of the control signal or a second conductive MOS transistor that receives the control signal by the gate thereof.

4. The semiconductor device according to claim 3, wherein backgates of the first conductivity type MOS transistors included in the interterminal opening/closing section and a backgate of the first conductivity type MOS transistor included in the current bypass section are mutually coupled.

5. The semiconductor device according to claim 1, further comprising:
a second conductivity type MOS transistor, a source or drain of which is coupled to the source or drain of the first-stage first conductivity type MOS transistor, and another source or drain of which is coupled to the source or drain of the last-stage first conductivity type MOS transistor, and a gate of which receives a signal obtained by inverting a logic state of the control signal.

6. The semiconductor device according to claim 1, further comprising:
a first resistor, one end of which is coupled to the source or drain of the first-stage first conductivity type MOS transistor and other end of which is used as the first terminal; and
a second resistor, one end of which is coupled to the source or drain of the last-stage first conductivity type MOS transistor and other end of which is used as the second terminal.

7. The semiconductor device according to claim 1, wherein each said first-stage first conductivity type MOS transistor is a first conductivity type-only MOS transistor.

8. A semiconductor device comprising:
a first P-channel type MOS transistor, a source or drain of which is used as a first terminal;
a second P-channel type MOS transistor, a source or drain of which is coupled to the source or drain different from the first terminal and other source or drain of which is used as a second terminal; and
a third P-channel type MOS transistor, a drain of which is coupled to a connection node between the first and second P-channel type MOS transistors coupling the respective sources or drains of the first and second P-channel MOS transistors with each other, and a source of which receives a power source voltage,
wherein backgates of the first to third P-channel type MOS transistors are coupled to the power source voltage,
wherein gates of the first and second P-channel type MOS transistors receive a control signal for controlling an opening or short-circuiting between the first and second terminals,
wherein a gate of the third P-channel type MOS transistor receives a signal obtained by inverting a logic state of the control signal,
wherein said first and second terminals are coupled to respective first and second differential signal lines each connected to a respective one of a pair of input/output terminals of a host,
wherein said semiconductor device further comprises a first single-ended receiver constructed to output a first signal based on whether or not a voltage present at said first differential signal line exceeds a threshold voltage, and a second single-ended receiver constructed to output a second signal based on whether or not a voltage present at said second differential signal line exceeds said threshold voltage, and
wherein said host is configured to determine that a device has been coupled to said pair of input/output terminals of the host based on said first and second signals having different states.

9. A communication interface circuit comprising:
an interterminal opening/closing section having a plurality of first conductivity type MOS transistors, the respective sources or drains of which are cascaded,
wherein a source or drain of a first-stage first conductivity type MOS transistor among the cascaded first conductivity type MOS transistors is used as a first terminal,
wherein a source or drain of a last-stage first conductivity type MOS transistor among the cascaded first conductivity type MOS transistors is used as a second terminal, and
wherein the respective gates of the cascaded first conductivity type MOS transistors receive a control signal for controlling an opening or short-circuiting between the first and second terminals, and
a current bypass section that reduces a current flowing into a connection node coupling the respective sources or drains of the cascaded first conductivity type MOS transistors with each other,
wherein the first terminal is coupled to a terminal for receiving one of a pair of differential signals,
wherein the second terminal is coupled to a terminal for receiving the other of a pair of differential signals,
wherein said first and second terminals and said pair of differential signal lines are connected to a pair of input/output terminals of a host,
wherein said communication interface circuit further comprises a first single-ended receiver constructed to output a first signal based on whether or not a voltage present at said first differential signal line exceeds a threshold voltage, and a second single-ended receiver constructed to output a second signal based on whether or not a voltage present at said second differential signal line exceeds said threshold voltage, and
wherein said host is configured to determine that a device has been coupled to said pair of input/output terminals of the host based on said first and second signals having different states.

10. The communication interface circuit according to claim 9, wherein the communication interface circuit complies with USB (Universal Serial Bus) Specifications and transmitting/receiving data.

11. The communication interface circuit according to claim 9, wherein each said first-stage first conductivity type MOS transistor is a first conductivity type-only MOS transistor.

* * * * *